United States Patent [19]

Leriche et al.

[11] Patent Number: 5,179,075
[45] Date of Patent: Jan. 12, 1993

[54] METHOD OF MAKING A LOW ELECTRICAL RESISTANCE CONNECTION BETWEEN A METAL AND A HIGH $T_c$ SUPERCONDUCTING CERAMIC

[75] Inventors: Albert Leriche, Paris; Gérard Duperray, La Norville; Fernand Grivon, Saint Michel sur Orge, all of France

[73] Assignee: GEC Alsthom SA, Paris, France

[21] Appl. No.: 604,281

[22] Filed: Oct. 29, 1990

[30] Foreign Application Priority Data

Nov. 3, 1989 [FR] France .................... 89 14432

[51] Int. Cl.[5] .............................. H01B 12/00
[52] U.S. Cl. ............................ 505/1; 419/6; 419/21; 419/22; 428/471; 428/552; 428/632; 505/706
[58] Field of Search .................. 419/6, 21, 22; 505/1, 505/706; 428/552, 632, 471

[56] References Cited

U.S. PATENT DOCUMENTS 5,071,826 12/1991 Anderson et al. .................... 419/21

FOREIGN PATENT DOCUMENTS 0292126 11/1988 European Pat. Off. .

OTHER PUBLICATIONS

IEEE Transactions on Magnetics, vol. 25, No. 2, Mar. 1989, pp. 2056–2059, IEEE, New York, USA & Applied Superconductivity Conference, Aug. 1988, San Franciso, USA; J. Moreland et al.: "Ag screen contacts to sintered YBa2Cu30x powder for rapid superconductor characterization".

Japanese Journal of Applied Physics, vol. 28, No. 10, Oct. 1989, pp. L1740–L1741, Tokyo, JP; N. Murayama et al.: "Joining of hot-pressed Bi-Pb—Sr-Ca-Cu-O superconductor".

Primary Examiner—Stephen J. Lechert, Jr.
Attorney, Agent, or Firm—Sughrue, Mion, Zinn, Macpeak & Seas

[57] ABSTRACT

A method of making at least one low electrical resistance connection between a metal and a high $T_c$ superconducting ceramic part, said part being made from a ceramic powder which is placed in a mold, compressed, and sintered, wherein at least one volume of silver or gold powder corresponding to the shape of said connection and situated at the desired location is placed inside said mold in juxtaposition with said ceramic powder but without being mixed therewith, after which the compression and the sintering are performed under an atmosphere containing oxygen and at a temperature that is lower than the melting temperature of silver or gold.

4 Claims, 1 Drawing Sheet

METHOD OF MAKING A LOW ELECTRICAL RESISTANCE CONNECTION BETWEEN A METAL AND A HIGH $T_c$ SUPERCONDUCTING CERAMIC

The present invention relates to a method of making a low electrical resistance connection between a metal and a high $T_c$ superconducting ceramic.

BACKGROUND OF THE INVENTION

The problem is to provide a low electrical resistance connection between a metal and a superconducting ceramic in order to convey high currents at the utilization temperature without disturbing the zero resistance state. Thus, such a connection must have a resistivity of less than $10^{-10}$ $\Omega \cdot m^2$ for passing a current density of about $10^3$ A/cm$^2$, as is applicable when using a current lead.

At present, good electrical contacts having resistivity of about $10^{-10}$ $\Omega \cdot m^2$ and used with a $YBa_2Cu_3O_{7-\delta}$ type ceramic are made by depositing a layer of silver on respective small areas by cathode sputtering. However such a deposit of silver does not adhere well enough to provide a robust and effective connection between the ceramic and a normal metal.

The article entitled "Low resistivity contacts to bulk high Tc superconductors" published on page 2605 of Appl. Phys. Lett. 54 (25), Jun. 19, 1989 describes a method consisting in placing ceramic powder in a mold, in inserting 0.125 mm diameter silver wires orthogonally to the layer of powder, in covering the ceramic powder while allowing the wires to protrude, in compressing the powder, and in baking it. It is observed that such a method is difficult to implement since the silver wires must not be damaged when compression is taking place. In addition, the wires are capable of passing low currents only of about 5 amps.

The above-mentioned article also proposes another method consisting in putting a uniform mixture of ceramic powder and silver powder into a mold, in compressing the mixture, and in baking it at a temperature of 1030° C., which temperature is higher than the melting point of silver. Bubbles are then created, particles of silver disperse, and appear on the surface of the part, thereby defining electrical contacts. The method makes it very difficult to control the shape of these contacts.

The object of the present invention is to avoid these drawbacks and to implement an industrial method capable of ensuring a robust connection with a ceramic.

SUMMARY OF THE INVENTION

The present invention provides a method of making at least one low electrical resistance connection between a metal and a high $T_c$ superconducting ceramic part, said part being made from a ceramic powder which is place in a mold, compressed, and sintered, wherein at least one volume of silver or gold powder corresponding to the shape of said connection and situated at the desired location is placed inside said mold in juxtaposition with said ceramic powder but without being mixed therewith, after which the compression and the sintering are performed under an atmosphere containing oxygen and at a temperature that is lower than the melting temperature of silver or gold.

In a first variant implementation, said part is to be in the form of a pellet: the mold receives a first volume of silver powder forming a first silver layer, then the ceramic power, and then a second volume of silver powder forming a second silver layer, and the assembly is compressed by means of a press and is baked. A pellet is obtained which is provided on each face with a layer of silver that is more than 0.1 mm thick, e.g. about 0.2 mm to 0.5 mm thick.

In a second variant implementation, said part is to be in the form of a rod or a tube: two volumes of silver powder are placed in the mold at respective ends of said bar or tube.

The present invention also provides a ceramic part provided with its electrical connection. The ceramic part may be based on a bismuth compound, or a Y.Ba.-Cu.O compound, and the part may optionally be doped by not more than 20% by weight of silver or gold. The part may also be based on a mixture of the above compounds.

By using the method of the invention, a connection is provided which is constituted by a layer of silver with good adherence on the ceramic. This makes connection to an ordinary metal easy by using solder based on tin or lead.

Other features and advantages of the present invention appear from the following description of implementations given by way of non-limiting illustration.

DETAILED DESCRIPTION

In a first example, $YBa_2Cu_3O_{7-\delta}$ ceramic is used to make a pellet having a thickness of 4 mm, a section of 1 cm$^2$, and having a 0.5 mm thick layer of silver on each of its faces.

In accordance with the invention, and prior to the compacting operation, a layer of silver powder is deposited in the bottom of the mold, followed by ceramic powder, and then by another layer of silver powder. Compression is performed by means of a conventional press. The pellet is then subjected to conventional sintering treatment under an atmosphere containing oxygen and using a maximum temperature of 930° C.

Figure 1:
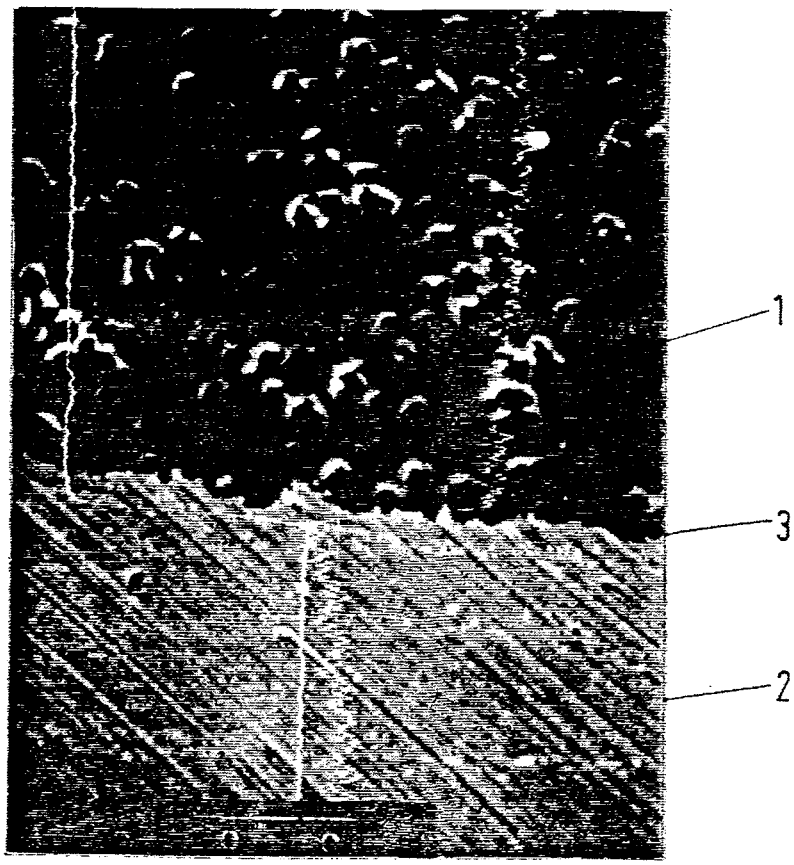
FIG. 1 is a magnified fragmentary section of a low electrical resistance connection between a metal and a high $T_c$ superconducting ceramic part forming a preferred embodiment of the invention.

FIG. 1 is a magnified fragmentary section ($\times 1000$) showing a superconducting ceramic pellet 1 made of Y.Ba.Cu.O together with its layer of silver 2. The interface is referenced 3. It can be seen that the silver layer 2 adheres without apparent diffusion of the silver grains into the ceramic 1, and vice versa. The mechanical strength of the bond is higher than that of the superconducting ceramic, namely $16 \times 10^6$ pascals. At 77K the interface does not deteriorate. Since the layer of silver thus adheres well to the ceramic, it may be soldered to copper using a tin based solder containing 4% silver. The resulting resistivity is about $10^{-11}$ $\Omega \cdot m^2$ at 77K and about $10^{-12}$ $\Omega \cdot m^2$ at 4.2K.

Figure 2:
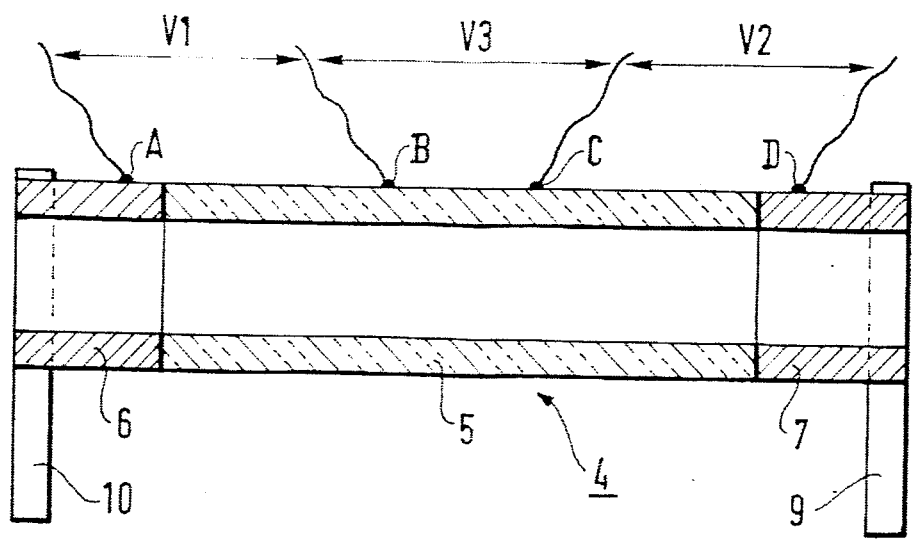
FIG. 2 is a longitudinal sectional view of a cylindrical tube forming a further embodiment of the invention.

In a second example, the same procedure is used to make a tube 4 which is shown in section in FIG. 2.

The central portion 5 of the tube 4 is obtained using 12 grams (g) of a mixture of Y.Ba.Cu.O ceramic powder doped with 10% silver. Initially, 5 g of silver powder corresponding to an annular connection 6 are deposited in the mold, followed by the volume of ceramic powder, followed by a further volume of 5 g of silver powder corresponding to annular connection 7.

Isostatic compression is then performed at 200 MPa, followed by sintering. Heat treatment is applied in air for a period of 7 hours. The heat treatment should include slow temperature changes (0.5° C. per minute) and a reoxidation pause of 15 hours at around 450° C.

After treatment, one such tube 4 had the following dimensions:

| outside diameter: | 11.5 mm |
|---|---|
| inside diameter: | 8.9 mm |
| length: | 60 mm |

Its critical transport current was measured using the "4 point" method, the points being referenced A, B, C, and D. A critical current density of 720 A/cm$^2$ was obtained by applying the 1 $\mu$V/cm criterion. Under such conditions, the magnetic field set up at the surface of the sample by the flow of current is 10 mTesla.

In the drawing:

$V_1$ and $V_2$ are the voltage drops due to the silver-ceramic connection terminals; and $V_3$ is the voltage drop of the ceramic during transition, with the current I being the critical current when $V_3 = 1\mu V$ (distance BC=1 cm).

The values of the resistivity of the silver-ceramic connections are reproducible and relatively constant between $2 \times 10^{-11}$ $\Omega \cdot m^2$ and $3 \times 10^{-11}$ $\Omega \cdot m^2$ while the current is varied to up to close to the critical current density which corresponds to the transition point of the superconducting material. In FIG. 2, it can be seen that current terminals 9 and 10 are soldered direction to the connections 6 and 7.

The method of the invention is thus an industrial method enabling a robust connection to be obtained between the ceramic and a metal over areas of several cm$^2$ and with low contact resistance.

Naturally, the invention is not limited to the embodiments described above. Without going beyond the scope of the invention, any means may be replaced by equivalent means.

We claim:

1. A method of making at least one low electrical resistance connection between a metal and a high $T_c$ superconducting ceramic part, said part being made from a ceramic powder which is placed in a mold, compressed, and sintered, wherein at least one volume of silver or gold powder corresponding to the shape of said connection and situated at the desired location is placed inside said mold in juxtaposition with said ceramic powder but without being mixed therewith, after which the compression and the sintering are performed under an atmosphere containing oxygen and at a temperature that is lower than the melting temperature of silver or gold.

2. A method according to claim 1, wherein said part is in the form of a pellet, and the following are placed in said mold: a first volume of silver powder forming a first layer, then the semiconducting ceramic powder, then a second volume of silver powder forming a second layer.

3. A method according to claim 1, wherein said part is in the form of a tube or a rod, and two volumes of silver powder are provided in said mold at respective ones of the two ends of said tube or said rod.

4. A method according to claim 1, wherein said high $T_c$ ceramic is one material optionally doped with not more than 20% be weight of silver or gold selected from the group consisting of compounds of bismuth, compounds of Y-Ba-Cu-O, and mixtures of said compounds.

* * * * *